United States Patent [19]

Schwartz et al.

[11] 4,283,774

[45] Aug. 11, 1981

[54] ON-CHIP METHOD OF BALANCING MEMORY DETECTORS AND BALANCED DETECTORS FORMED THEREBY

[75] Inventors: Sidney J. Schwartz, Vista; Farooq M. Quadri, San Jose; Chung-Herng Hsin, Irvine, all of Calif.

[73] Assignee: Burroughs Corporation, Detroit, Mich.

[21] Appl. No.: 48,087

[22] Filed: Jun. 13, 1979

[51] Int. Cl.$^3$ ............................................. G11C 19/08
[52] U.S. Cl. ........................................ 365/8; 338/195
[58] Field of Search ...................... 365/8, 223, 91, 158; 338/195; 323/75 L; 324/57 N

[56] References Cited

U.S. PATENT DOCUMENTS

| | | | |
|---|---|---|---|
| 2,261,667 | 11/1941 | Stroszeck | 338/195 |
| 3,161,858 | 12/1964 | Sanders et al. | 365/223 |
| 3,858,189 | 12/1974 | Beausoleil et al. | 365/8 |
| 3,930,304 | 1/1976 | Keller et al. | 338/195 |
| 3,952,291 | 4/1976 | Bailey et al. | 365/8 |
| 4,035,785 | 7/1977 | Kryder | 365/8 |
| 4,078,230 | 3/1978 | George | 365/8 |
| 4,146,867 | 3/1979 | Blangeard | 338/195 |
| 4,150,366 | 4/1979 | Price | 338/195 |

OTHER PUBLICATIONS

IBM Technical Disclosure Bulletin–vol. 13, No. 5, Oct. 1970, p. 1105.

Primary Examiner—James W. Moffitt
Attorney, Agent, or Firm—Charles J. Fassbender; Kevin R. Peterson

[57] ABSTRACT

A method of forming detector and dummy detector pair(s) of magnetoresistive elements on a bubble memory chip, with detector and dummy detector each having a balancing resistance network comprising parallel spaced apart end-connected lines of resistive material with the transverse legs (rungs) spaced between said parallel lines to form a ladder in-line (electrically) between the detector and pads for selectively balancing the pair(s), and for disconnecting certain rungs of the spaced apart end connected lines, if necessary, to change the path of current flow through the ladder and thus vary the resistance through the ladder. The product formed by the method comprises on-chip magnetoresistive detector element pair(s) including balancing resistance ladders, coupled in the current paths of the magnetoresistive elements, and having portions which can be selectively disconnected to change resistance of the ladder to balance the bridge network.

10 Claims, 6 Drawing Figures

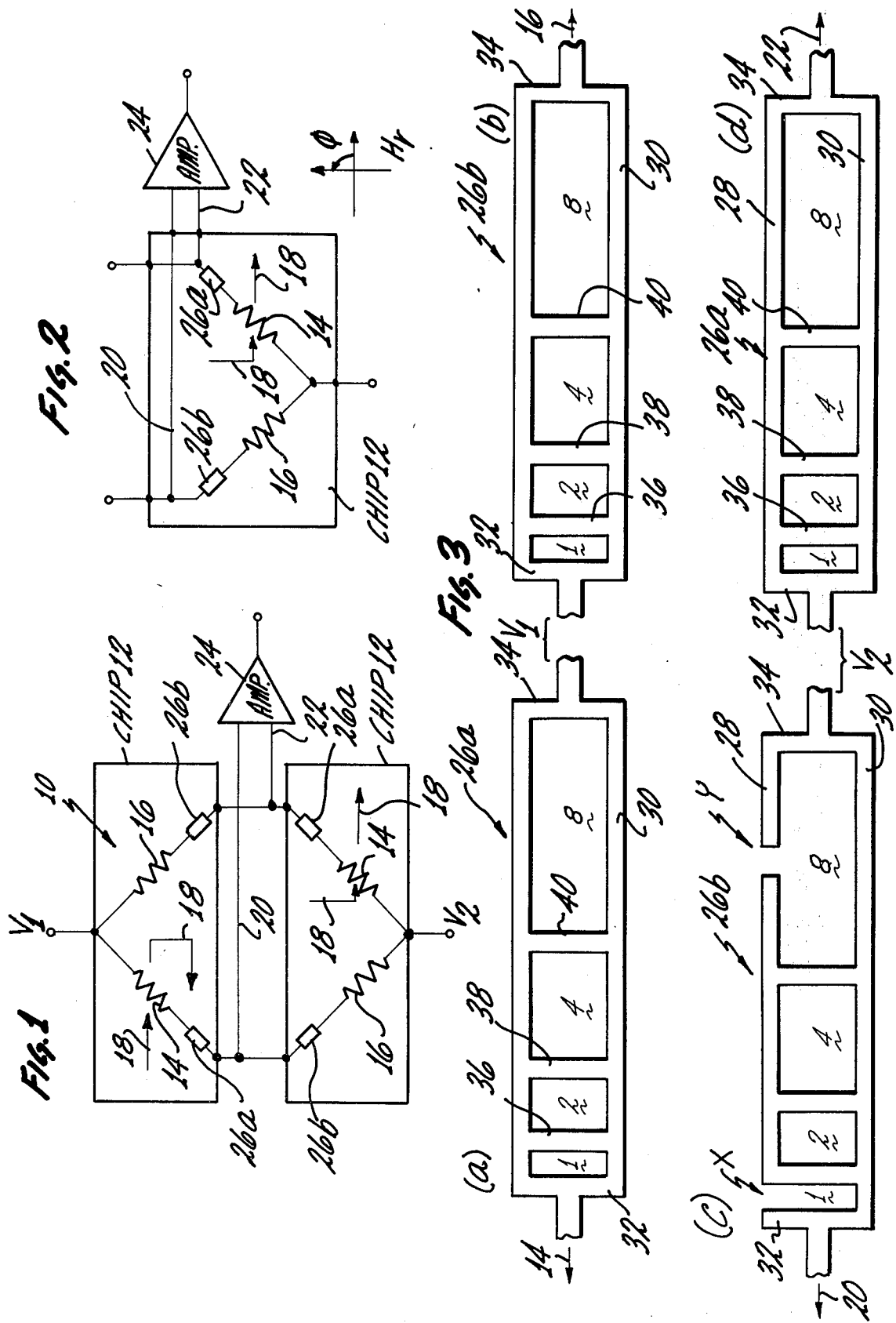

ON-CHIP METHOD OF BALANCING MEMORY DETECTORS AND BALANCED DETECTORS FORMED THEREBY

BACKGROUND OF THE INVENTION

This invention relates to bubble (magnetic domain) memories and, in particular, to a method of resistance matching, useful for forming detectors for bubble memory chips, or stated another way, to an on-chip method of balancing bubble memory detectors, and to a balanced detector formed thereby.

Bubble memory chips have means for forming and supporting bubbles under a suitable magnetic bias field and for propagating bubbles on propagate elements, serially, as a stream in response to a rotating in-plane magnetic field are, of course, old at this time.

The use of magnetoresistive detectors, usually formed of chevron type permalloy propagate elements, which change resistance due to the presence of a bubble thereunder are old in the art. These detectors are usually arranged in a bridge network of two or four legs formed by the magnetoresistive detectors and connected to a suitable source of current. In the two legged bridge, one leg forms an active detector and the other leg forms a dummy detector; the former being the detector through which the bubbles are propagated and the latter, while subject to the same in-plane rotating magnetic field, is out of the bubble path and is for the purpose of providing a noise signal approximately the same in amplitude, frequency and phase as the signal representing the absence of a bubble in the active leg of the detector. In the case of a four legged bridge arrangement, there are two active detectors and two dummy detectors while in the case of the two legged bridge network balancing resistors or constant current sources are used; all for the purpose of maintaining the current through each leg of the bridge is the same.

Thus, when a bubble is expanded and propagated through the active detector, a signal of one amplitude is generated due to the change in resistance of the active detector elements, but, on the other hand, if there is no bubble under the active detector, a signal of lesser amplitude is generated and both these signals are sensed by a read-out device, such as a differential amplifier. The differential amplifier often used is a Motorola sense amplifier MC1544/1444 which includes a clamp circuit (capacitor restore), to set the voltage level at which the generated signal is to be compared, and a strobe circuit to sample the signal at a preselected time. This amplifier has a gain which is sensitive to the imbalance occurring across the input terminals at the time the amplifier is unclamped. Thus, if the balance across the bridge network is not a good one, then the signal to the amplifier is unbalanced at all times which reduces the gain of the amplifier to the point where detection becomes marginal.

Typically, to block the DC component signal, i.e., the offset signal, due to the unbalance of the bridge, capacitors and hold-down resistors are introduced between the bridge and the amplifier and accordingly, it is one object of this invention to eliminate these parts.

It should be pointed out also, that with the present trend toward a reduction in magnetic bubble sizes, and concomitantly, a decrease in the cross sectional areas of the magnetoresistive elements themselves, contributes to the offset signal problem due to the unbalance of the bridge network.

This invention shows how a balancing of the bridge network can be achieved without putting impractical constraints on processing techniques and improving the chance of utilizing smaller bubbles, thus increasing bit density and reducing the cost of bubble memories.

Accordingly, it is an object of this invention to provide a method of on-chip balancing of detectors to eliminate the offset voltage problem imposed by the conventional sense amplifier.

A more specific object of this invention is to provide a method of balancing a bridge network detector arrangement for bubble memory chips by providing a balancing resistor ladder of a plurality of resistance elements which can be selectively disconnected.

Another specific object of the invention is to provide a balancing resistor ladder arrangement on a magnetic bubble chip comprising a plurality of resistance which can be selectively disconnected to balance an on-chip bubble detector bridge arrangement.

SUMMARY OF THE INVENTION

The method which comprises this invention and meets the foregoing objects includes the forming of a detector of a bridge type network of magnetoresistive elements on a bubble memory chip, forming a balancing resistance network comprising parallel spaced apart end-connected lines of resistive material with the transverse legs (rungs) spaced between said parallel lines to form a ladder in-line (electrically) with the detector for selectively balancing the bridge network, and disconnecting certain portions of the spaced apart end connected lines, if necessary, to change the path of current flow through the ladder and thus vary the resistance of the ladder.

The product formed by the method comprises magnetoresistive detector elements formed into a bridge type network by which bubbles propagated serially thereto are expanded to change the resistance of the magnetoresistive elements, including a balancing resistance ladder, coupled in the current paths of the detector and dummy detector pair(s), and having portions which can be selectively disconnected to change resistance of the ladder to balance the pairs.

BRIEF DESCRIPTION OF THE DRAWINGS

FIG. 1 illustrates a magnetic bubble detector arrangement with the bridge network direct coupled to a sense amplifier and showing balancing resistors in each leg of the bridge each in the form of an adjustable ladder-resistor network constructed in accordance with the teachings of this invention;

FIG. 2 illustrates a half bridge with one dummy detector and one active detector formed with load resistors and a voltage source or current sources together with adjustable ladder-resistor networks of this invention; and FIGS. 3(a)–(d) are enlarged illustrations of the specific embodiment of the ladder-resistor network with two conductor lines disconnected to illustrate the adjustment of the resistance to balance a bridge network.

BRIEF DESCRIPTION OF THE PREFERRED EMBODIMENT

Turning now to FIG. 1, there is disclosed a bridge type magnetoresistive arrangement 10 as the detector areas on two bubble chips 12 which, though not disclosed, are conventionally formed of suitable material on which conditions exist for establishing single wall domains with magnetically soft propagate elements organized in patterns, such as storage loops, input and output gates, and tracks together with suitable bias sources, control circuits and in-plane magnetic field source for domain propagation.

Shown as legs of the bridge arrangement 10, are active detectors 14 and dummy detectors 16, formed of propagate elements conventionally of the chevron type; the active detectors 14 being in the bubble flow path while the dummy detectors 16 are used to balance the resistance of the active detector and to provide for a.c. balance a noise signal approximately the same in amplitude, frequency and phase as the signal representing the absence of a bubble in the active leg of the detector. The bridge is connected between voltage sources V1 and V2 for the supply of current on the paths between the voltage sources and is within the rotating magnetic field $H_r$ for propagating the domains. Arrows 18 depict the bubble flow path formed of the propagate elements simply to indicate that the dummy detectors are not in the flow path.

FIG. 2 discloses a bridge type magnetoresistive arrangement 10 like that of FIG. 1 but with only two legs of detectors 16 and 14 connected to either a pair of external bridge resistors or constant current sources (not shown). The half bridge of this Figure corresponds in operation to that of FIG. 1 and thus the same reference numerals are used to denote similarly functioning elements.

In either of these embodiments, conductor lines 20 and 22 couple the bridge network directly to the terminals of a sense amplifier 24, such as Motorola MC1544L/1444L, or its equivalent. This sense amplifier 24 is provided with a clamp terminal, a strobe terminal and an output terminal where a pulse is generated according to the amplitude of the signal sampled by the amplifier and, although not shown in this Figure, the amplifier actually has four pairs of inputs which can be digitally selected so that a single amplifier can service eight different bubble detectors.

Taking, for example, the presence of a bubble under one of the active detector legs, the operation of the system as shown in FIG. 1, would produce an unbalance in the bridge network which would be sensed as a positive going pulse signal at the amplifier input terminals. The amplifier contains a clamp circuit activated at the clamp terminal (capacitor restore) which selects the voltage reference level with which the signal is compared at strobe time. The strobe circuitry is activated at the strobe terminal which selects the time at which the signal can be read after unclamping has occurred.

Since the operation of the sense amplifier is well known, no further discussion is deemed necessary herein, and as hereinabove stated, it is the unbalance of a bridge network which provides a limitation in the signal being sensed by the sense amplifier and it is to this problem that this invention is addressed.

Now, turning again to FIGS. 1 and 2, there is shown, in the current flow lines of both active and dummy detectors, a plurality of adjustable balancing resistor networks to adjust the resistance of each leg of the bridge. These balancing resistor networks are shown as boxes 26a and 26b in FIGS. 1 and 2, where 26a represents the balancing adjustable resistor network for the active detector and 26b represents the balancing adjustable resistor network for the dummy detector. In practice, these balancing resistor networks are alike but are denoted as 26a and 26b herein to illustrate that there is one for each leg of the detectors.

FIGS. 3(a)–(d) show the method of balancing of bridge utilizing the balancing resistor network in more detail. This Figure shows that the balancing resistor network in the form of a ladder-resistor network comprising parallel legs 28 and 30 connected at each end by branch legs 32 and 34 to the legs 28 and 30 which connect to the source of voltage and to the detectors and output lines, as the case may be, such as connected in-line for the bridge of FIG. 1 as indicated by the reference numerals 14,16 etc.

In between the end branch lines 32,34 is a plurality of transverse lines 36–40 forming, as it were, rungs in a ladder. It is to be noted that the spacing between each of the rungs and the end branch connectors is varied, so that only a few cuts need be made in parallel legs (28,30) branch legs (32,34) and transverse lines (36–40) to adequately balance the active and dummy detectors. One method is to use binarily weighted rung spacing so that specific cut points will change resistance by 1, 2, 4 and 8 ohms and the total amount by which the resistance of the selected bridge leg is changed is the sum of the changes resulting from the ladder leg and rung openings. Other none binary weightings could be chosen as well. For example, in FIG. 3, lines 28 of the matching adjustable resistor ladder network 26b for dummy detector 16 is cut or trimmed at X and Y to change the direction of the current flow through the ladder and thus increase the resistance in the leg of the bridge network. In the example, this increase is a 9 ohm increase. The amount of resistance can vary, for example, cutting all of the lines between the rungs of this ladder would allow a correction of 15 ohms. From the foregoing, it can be seen that a resistance correction for each of the legs can be from 1 to 15 ohms; 1 ohm resistance representing a change of resistance value of about 1 percent in the total resistance of the typical bridge leg.

In general, with the utilization of these adjustable resistor-ladder networks allows an on-chip balancing of the DC resistance of a bridge type network to be performed so that a sense amplifier can be directly coupled to the chip; said amplifier having a gain that would otherwise be sensitive to the offset voltage due to the DC unbalance of the detector bridge. It should be pointed out also, that the commercially available laser trimmer equipment is suitable for the trimming of the ladder and that by this method the elimination of coupling capacitors and hold-down resistors at the amplifier have been eliminated and chip board space has been saved and cost of these parts has been eliminated.

What is claimed is:

1. A method of enhancing the detecting means in a magnetic bubble device which has structure for supporting bubbles thereon and elements disposed in an arrangement in which bubbles propagate serially in response to a rotating in-plane magnetic field, the steps of, forming a detector of a bridge type configuration on said structure and connected to said elements so as to receive said bubbles propagated thereto, forming parallel spaced apart end connected lines of resistance material with transverse spaced apart legs of resistance therebetween to form a ladder, said ladder being located in the output of said bridge configuration, and balancing the bridge, if necessary, by disconnecting certain portions of the ladder to vary the resistance through the ladder.

2. The method as claimed in claim 1, wherein the steps of forming spaced apart legs includes forming said legs at varied distances thereof so that the resistance can be selected in weighted increments.

3. The method as claimed in claim 1, wherein the steps of forming spaced apart legs includes forming said legs at varied distances thereof so that the resistance can be selected in weighted binary increments.

4. The method as claimed in claim 1, wherein the disconnection of certain portions of the ladder is done by laser.

5. In a magnetic bubble device having structure for supporting bubbles thereon and elements disposed in an arrangement in which bubbles propagate serially in response to a rotating in-plane magnetic field, detector means for receiving said bubbles and for detecting the presence or absence of said bubbles and producing electrical signals representing the presence or absence of said bubbles in said detector means, and resistance matching means in-line with the output of said detector means whose resistance may be varied to balance the detector means for maximum amplitude of the signals to a signal processing means.

6. The bubble device as claimed in claim 5, wherein said detector means is arranged in the form of a bridge network with at least one detector for receiving said bubbles and for detecting the presence or absence of said bubbles, at least one detector out of the path of bubble propagation and with one resistance matching means associated with each detector and wherein said resistance matching means comprises a resistance ladder network in the form of parallel spaced apart end connected lines with transverse spaced apart legs.

7. The magnetic bubble device as claimed in claim 6, wherein said spaced apart legs are at variable distances from one another so that portions of the spaced apart parallel lines may be disconnected in increments representing weighted values.

8. The magnetic bubble device as claimed in claim 6, wherein said spaced apart legs are at variable distances from one another so that portions of the spaced apart parallel lines may be disconnected in increments representing binary values.

9. The magnetic bubble device as claimed in claim 6, wherein said signal processing means comprises a sense amplifier for receiving said signals from said detector means.

10. In a magnetic bubble device having structure for supporting bubbles thereon and elements disposed in an arrangement in which bubbles propagate serially in response to a rotating in-plane magnetic field, detector means for receiving said bubbles and for producing electrical signals representing the presence or absence of said bubbles in said detector means, wherein said detector means includes a bridge network with a first detector means in the bubble propagation path having a resistance which varies in response to the presence or absence of said bubbles, a second detector means out of the bubble propagation path having a fixed resistance, and a resistance matching means associated with each detector to balance the bridge network, said resistance matching means being comprised of uniformly spaced apart end connected lines with traverse legs that are spaced apart at variable distances from one another so that portions of the uniformly spaced apart lines may be disconnected in increments representing weighted resistive values.

* * * * *